(12) United States Patent
Shimamoto

(10) Patent No.: US 9,287,149 B2
(45) Date of Patent: Mar. 15, 2016

(54) WAFER HANDLING ROBOT

(75) Inventor: Mitsuru Shimamoto, Tsu (JP)

(73) Assignee: NABTESCO CORPORATION, Tokyo (JP)

( * ) Notice: Subject to any disclaimer, the term of this patent is extended or adjusted under 35 U.S.C. 154(b) by 203 days.

(21) Appl. No.: 13/993,617

(22) PCT Filed: Dec. 27, 2011

(86) PCT No.: PCT/JP2011/080250
§ 371 (c)(1),
(2), (4) Date: Jun. 12, 2013

(87) PCT Pub. No.: WO2012/101947
PCT Pub. Date: Aug. 2, 2012

(65) Prior Publication Data
US 2013/0336753 A1  Dec. 19, 2013

(30) Foreign Application Priority Data

Jan. 26, 2011 (JP) ................................. 2011-014073

(51) Int. Cl.
*B25J 9/10* (2006.01)
*H01L 21/677* (2006.01)
*B25J 11/00* (2006.01)

(52) U.S. Cl.
CPC ............... *H01L 21/677* (2013.01); *B25J 9/106* (2013.01); *B25J 9/1065* (2013.01); *B25J 11/0095* (2013.01); *H01L 21/67742* (2013.01)

(58) Field of Classification Search
CPC .......... B25J 9/1025; B25J 9/042; B25J 9/046; B25J 9/048; B65G 49/06; B65G 2249/04; H01L 21/677; H01L 21/67742; H01L 21/68707; Y10T 74/20305; Y10S 414/13

USPC ......... 318/568.11, 568.12; 414/744.1–744.5; 74/469, 490.01; 901/2, 11, 14, 15
See application file for complete search history.

(56) References Cited

U.S. PATENT DOCUMENTS 2,948,417 A  *  8/1960  Haanes ........................ 414/733
5,587,637 A     12/1996  Ohyama
(Continued)

FOREIGN PATENT DOCUMENTS

CN  101399217 A  4/2009
JP  7-237156     9/1995
(Continued)

OTHER PUBLICATIONS

English translation of International Preliminary Report on Patentability from parent International application No. PCT/JP2011/080250.
(Continued)

*Primary Examiner* — Ernesto Suarez
*Assistant Examiner* — Ronald Jarrett
(74) *Attorney, Agent, or Firm* — J-TEK Law PLLC; Jeffrey D. Tekanic; Scott T. Wakeman

(57) ABSTRACT

A wafer handling robot includes a body and an arm having a plurality of links. A wafer holder is provided on one end of the arm. A base of the arm serves as a drive link and is rotatably connected to the body. The arm is configured such that, when the drive link is rotated by a motor, the arm end is constrained to move along a straight or curved trajectory. A starting point and an end point of the trajectory are located equal distantly from a center of rotation of the drive link. Further, the direction of the arm end at the starting point is a mirror image of the direction of the arm end at the end point with respect to a straight reference line passing through the center of rotation and a middle point between the starting and the end points.

8 Claims, 14 Drawing Sheets

(56) References Cited

U.S. PATENT DOCUMENTS

| | | | |
|---|---|---|---|
| 5,765,983 | A | 6/1998 | Caveney et al. |
| 6,400,115 | B1 * | 6/2002 | Yamazoe ............... 318/568.11 |
| 6,450,757 | B1 | 9/2002 | Saeki et al. |
| 2003/0012632 | A1 | 1/2003 | Saeki et al. |
| 2007/0151388 | A1 * | 7/2007 | Yazawa et al. .......... 74/490.01 |
| 2009/0087932 | A1 | 4/2009 | Kondoh |
| 2010/0135752 | A1 * | 6/2010 | Imai ........................... 414/217 |
| 2011/0292527 | A1 * | 12/2011 | Frankovich et al. ......... 359/824 |

FOREIGN PATENT DOCUMENTS

| | | |
|---|---|---|
| JP | 2000-150617 | 5/2000 |
| JP | 2002-64128 | 2/2002 |
| JP | 2002-362738 | 12/2002 |
| JP | 2004-130459 | 4/2004 |
| WO | 97/45233 | 12/1997 |

OTHER PUBLICATIONS

International Search Report for parent PCT application No. PCT/JP2011/080250.

Office Action mailed Aug. 5, 2014 in counterpart JP application No. 2011-014073, including English translation thereof.

Office Action from the Chinese Patent Office dated Nov. 13, 2015 in counterpart Chinese application No. 201180065871.6, and translation of substantive portions thereof.

* cited by examiner

WAFER HANDLING ROBOT

CROSS-REFERENCE

This application is the US national stage of International Patent Application No. PCT/JP2011/080250 filed on Dec. 27, 2011, which claims priority to Japanese Patent Application No. 2011-014073, filed on Jan. 26, 2011, the contents of which are hereby incorporated by reference into the present application.

TECHNICAL FIELD

The present invention generally relates to a wafer handling robot that handles and positions a semiconductor wafer.

BACKGROUND ART

Wafer handling robots that handle and position a semiconductor wafer are known. A typical wafer handling robot includes an arm having a multi-link mechanism wherein a wafer holder is attached to an end. For example, this type of wafer handling robot is taught in Patent Document 1. The wafer handling robot of Patent Document 1 includes an arm having a mechanism called a frog leg type. The frog leg type is an arm having a closed link mechanism in which four links constitute a rectangle, and in which an arm end (positioned diagonally relative to a base) is moved backward and forward by changing an angle formed by two adjacent links. Further, in this type of arm, the arm end can be moved along an arc by rotating the base of the arm. The "wafer handling robot" will simply be called a "handling robot" hereinafter for the sake of simplicity. Further, the "semiconductor wafer" will simply be called a "wafer".

CITATION LIST

Patent Literature

Patent Document 1 Japanese Patent Application Publication No. 2000-150617

SUMMARY OF THE INVENTION

One usage of a handling robot is to move a wafer from one chamber to another chamber, these chambers facing one another. That is, the handling robot often requires a movable range of 180 degrees about a center of a base of an arm. On the other hand, since the chambers have their openings on their front faces, the handling robot may also require a mechanism for moving the arm end backward and forward at the front of the chamber. In order to meet the above requirements, the conventional handling robot is configured such that the base of the arm rotates. That is, the conventional handling robot requires a first operation for moving the arm end backward and forward, and a second operation for rotating the entire arm. Since the conventional wafer handling robot executes this type of two step motion, it takes time to move the wafer between the opposing chambers. The techniques disclosed in the present specification provide a handling robot capable of smoothly moving a wafer between opposing chambers.

The handling robot disclosed in the present specification comprises an arm (a multi-link arm) composed of a plurality of links from an arm end to a base of the arm. A wafer holder is provided at the arm end. A drive link that corresponds to the base of the arm is rotatably connected to a body. It is noted that the "drive link" means a link to which the driving force of an actuator is initially transmitted. This arm has a mechanism that restricts motion of the arm end, caused by rotation of the drive link, to a straight or curved trajectory, wherein a starting point and an end point of the trajectory of the arm end are positioned at an equal distance from a center of rotation of the drive link, and the directions of the arm end at the starting point and the end point of the trajectory satisfy a mirror image relationship with respect to a straight line passing through the center of rotation and a middle point between the starting and the end points. More preferably, the directions of the arm end at the starting and end points of the trajectory are opposite one another.

In the technical field of robotics, a "link mechanism that restricts motion of the arm end, caused by rotation of the drive link, to a straight or curved trajectory" is called a "constrained linkage mechanism" or a "one degree of freedom linkage mechanism". A typical example of a constrained linkage mechanism is a closed four-link crank-rocker mechanism. In addition to the constrained linkage mechanism, the arm has a mechanism such that the directions of the arm end at the starting point and the end point of the trajectory are opposite one another. Consequently, the starting point can be set in a first chamber, and the end point can be set in a second chamber that is opposite the first chamber. The arm can move smoothly along a straight or curved trajectory from the starting point to the end point.

Further, another advantage of the handling robot is it can move a wafer between two opposing chambers by using one actuator. For example, the handling robot of Patent Document 1 requires a first actuator for extending and contracting the arm, and a second actuator for rotating the arm. By contrast, the handling robot disclosed in the present specification can move a wafer by using one actuator.

In the handling robot, an arm end trajectory can be defined within a rectangular region having a long side and a short side, wherein the long side corresponds to a line segment connecting the starting and end points, and the short side has a length equal to a quarter of the long side. Defining the arm end trajectory in this manner enables a reduction of the space that must be ensured for moving the wafer between the two opposite chambers. Preferably, the arm end trajectory is straight.

Some specific mechanisms of the arm will be described in the embodiments. Further, the advantages of each arm will be also described in the embodiments.

DESCRIPTION OF THE EMBODIMENTS

First Embodiment

Figure 1:
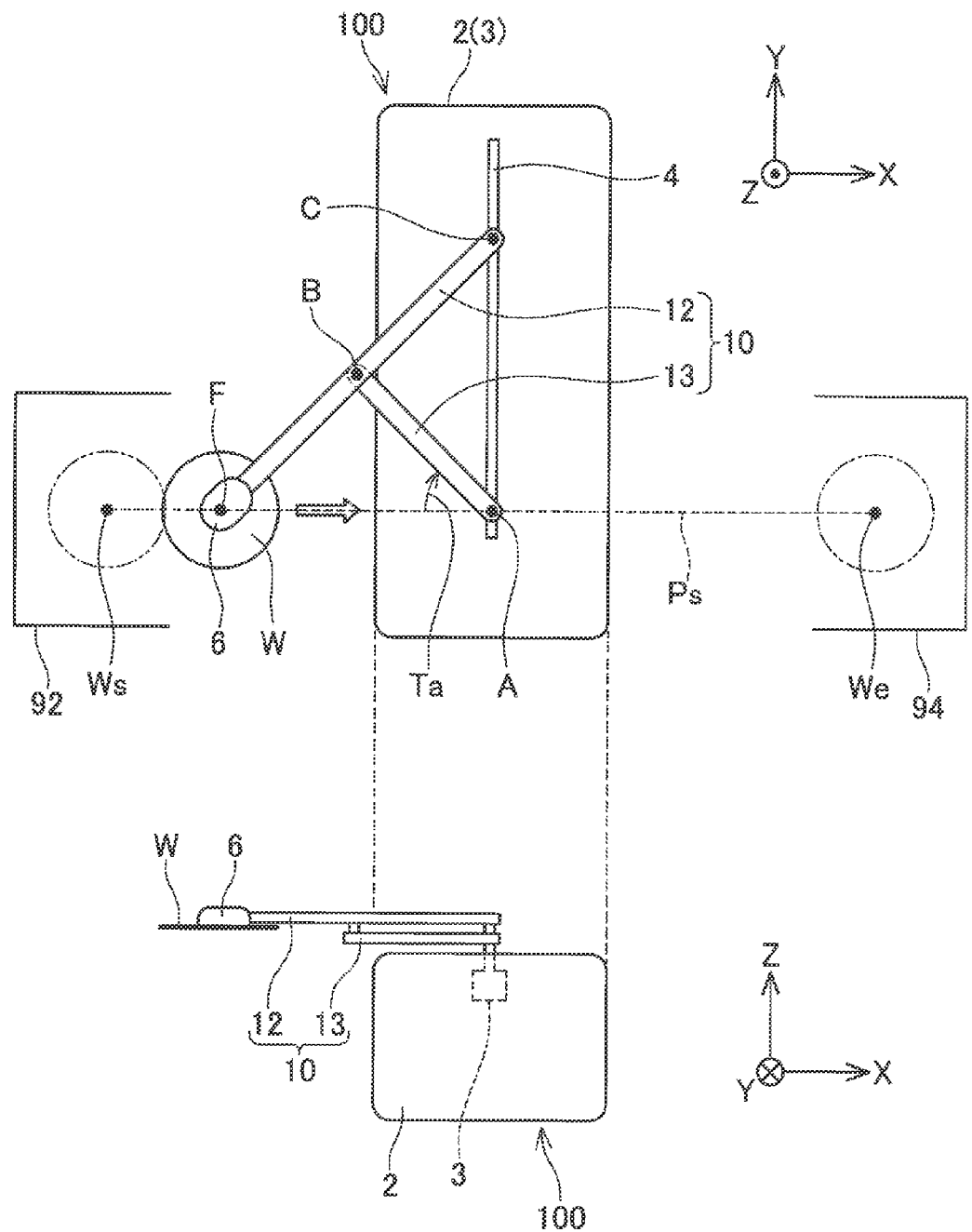
FIG. 1 is a plan view and a side view of a wafer handling robot of a first embodiment.

FIG. 1 is a plan view and a side view of a wafer handling robot 100 of the first embodiment. The upper side of FIG. 1 is the plan view, and the lower side is the side view. This wafer handling robot 100 transports a wafer W between a chamber 92 and a chamber 94, these being opposite one another. The wafer handling robot 100 can move the wafer W within a horizontal plane. Below, the "wafer handling robot" may simply be called the "robot". Further, in the coordinates in the Figures, the XY plane corresponds to a horizontal plane, and the Z axis corresponds to a vertical direction.

The robot 100 comprises a body 2 and an arm 10. The arm 10 is composed of a drive link 13 and a driven link 12. The drive link 13 corresponds to a base of the arm 10, and one end thereof is connected to the body 2. A motor 3 (an actuator) is provided within the body, and the motor 3 rotates the drive link 13 around point A. Moreover, point A corresponds to one end of the drive link 13, and also corresponds to a center of rotation of the arm 10. The other end (point B) of the drive link 13 is connected to a middle point of the driven link 12 in a longitudinal direction. A wafer holder 6 is attached to one end (point F) of the driven link 12, and a straight rail 4 is engaged with the other end (point C) of the driven link 12. The wafer holder 6 holds the wafer W by using an air suction system. Moreover, "point A", "point B", etc. are points set on the link, and mean any of a center of rotation of the link, a connecting point with another link, or a constraint point for a straight rail. Further, the "drive link" means a link to which, from among the links constituting the arm, torque of the motor (actuator) is first transmitted. Links other than the drive link correspond to the driven link(s).

Figure 2:
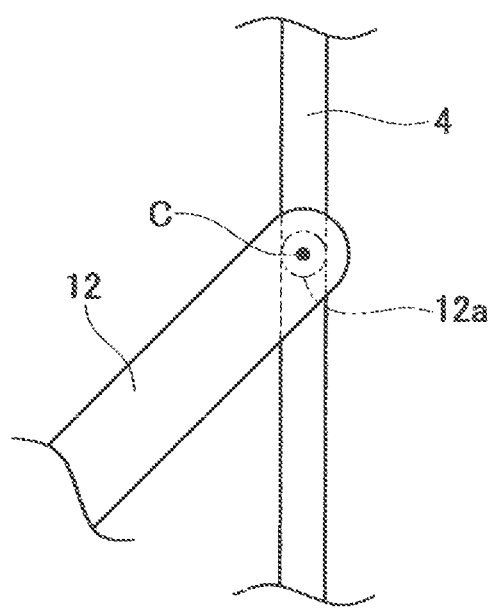
FIG. 2 is a partially enlarged plan view of the wafer handling robot of the first embodiment.

An enlarged plan view of the vicinity of point C is shown in FIG. 2. A slider 12a is attached to the other end (point C) of the driven link 12, and this slider 12a is engaged with the straight rail 4. The slider 12a can move along the straight rail 4. That is, one end (point C) of the driven link 12 can move along the straight rail 4.

In the arm 10, the movement of one end (point C) of the driven link 12 is restricted by the straight rail 4. Consequently, when the drive link 13 rotates in the clockwise direction around point A, an arm end (point F) moves along a straight or curved line. The trajectory Ps of the arm end depends on the geometrical shape (configuration) of each link. The arm 10 has the relationship AB=BC=BF. According to this relationship, a relationship in which the arm end (point F) moves along the straight line trajectory Ps when the drive link 13 rotates around point A can be obtained. The trajectory Ps of the arm end is a straight line, in which point Ws is the starting point and point We is the end point. Point Ws corresponds to a wafer set position of the one chamber 92, and point We corresponds to a wafer set position of the other chamber 94. It is noted that point We may be the starting point and point Ws may be the end point.

Figure 3A:
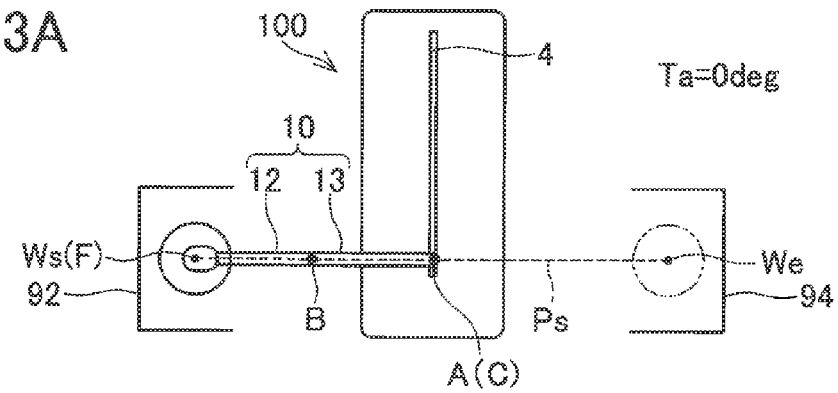
FIG. 3A is a diagram illustrating the movement of the wafer handling robot of the first embodiment (Ta=0 deg).
Figure 3B:
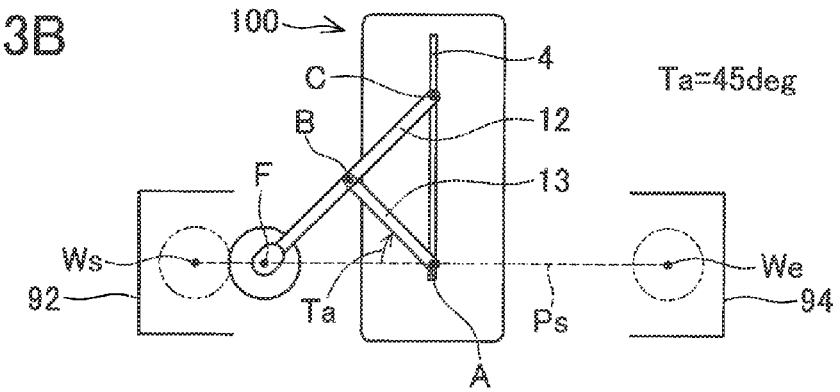
FIG. 3B is a diagram illustrating the movement of the wafer handling robot of the first embodiment (Ta=45 deg).
Figure 3C:
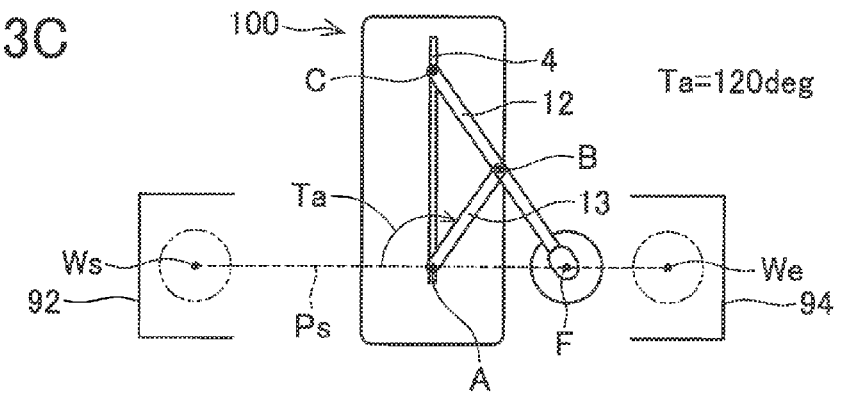
FIG. 3C is a diagram illustrating the movement of the wafer handling robot of the first embodiment (Ta=120 deg).
Figure 3D:
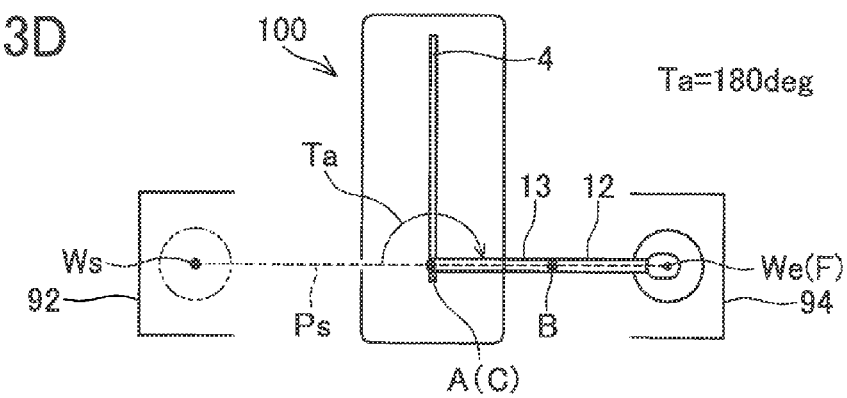
FIG. 3D is a diagram illustrating the movement of the wafer handling robot of the first embodiment (Ta=180 deg).

The movement of the arm 10 will be described with reference to FIG. 3A to FIG. 3D. Moreover, the movement of the arm 10 will be described using the angle Ta between the drive link 13 and a straight line connecting point Ws and point We. First, the arm end (point F) is located at the starting point Ws. This state corresponds to Ta=0 (deg) (FIG. 3A). The position of the arm 10 at Ta=45 (deg) is shown in FIG. 3B. At this configuration, the triangle ABC forms a right-angled isosceles triangle. Simultaneously, the triangle ABF also forms a right-angled isosceles triangle. Further, the following relationship is established: triangle ABC=triangle ABF. FIG. 3C shows the arm position at Ta=120 (deg), and FIG. 3D shows the arm position at Ta=180 (deg). As is clear from FIG. 3A to FIG. 3D, the end (point F) of the arm 10 moves along the straight line trajectory Ps. Further, the directions of the arm end at the starting point (point Ws) and at the end point (point We) of the trajectory Ps are mutually opposite.

Figure 4:
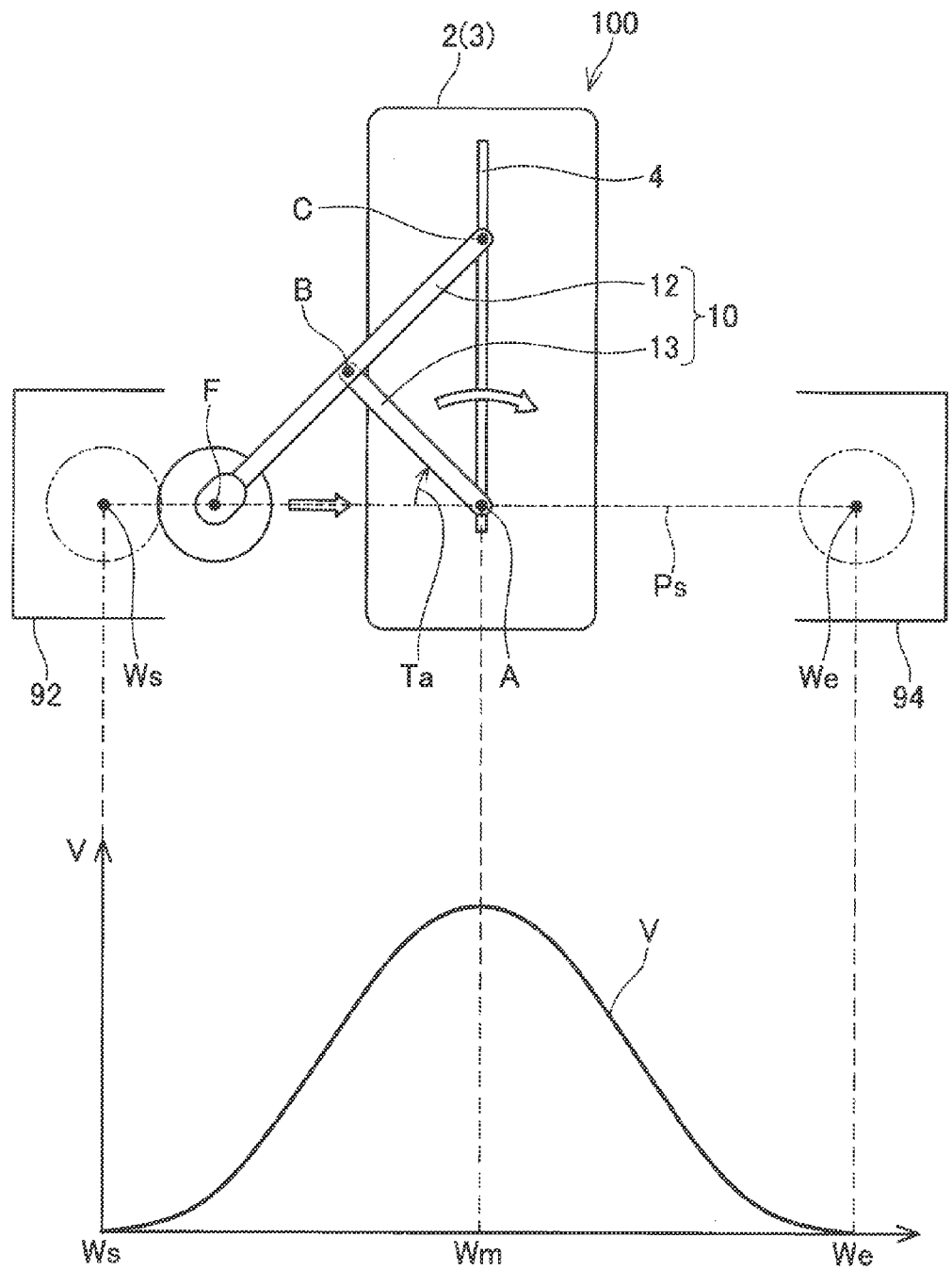
FIG. 4 is a graph of arm end speed.

The speed of the arm end will be described. FIG. 4 is a graph describing the change in speed V of the arm end while moving from the starting point (point Ws) to the end point (point We) when the drive link 13 is rotated at a constant angular velocity. As shown in FIG. 4, the speed V of the arm end increases monotonically from the starting point Ws to a middle point Wm, and decreases monotonically from the middle point Wm to the end point We. This is also clear from the structure of the arm 10 shown in the upper side of FIG. 4. That is, at the starting point Ws (end point We), the longitudinal direction of the drive link 13 is on a straight line connecting the center of rotation (point A) and the arm end (point F). This is because the speed of the arm end of the drive link 13 has the smallest contribution to the speed V of the arm in this type of geometric relationship. Moreover, the starting point Ws and the end point We of the trajectory Ps of the arm end correspond to "dead points" in a crank-piston mechanism.

The structure of the arm 10 can also be described as follows. The arm 10 comprises the drive link 13 and the driven link 12. One end of the drive link 13 is rotatably connected to the body 2, and the other end is connected to an intermediate portion along the driven link 12 in the longitudinal direction thereof (the center in the longitudinal direction). One end of the driven link 12 is connected, in a manner capable of sliding, to the straight rail 4 fixed to the body 2, and the wafer holder 6 is attached to the other end of the driven link 12. The other end of the driven link 12 corresponds to the arm end. One point of the arm 10 (one end of the driven link 12) is constrained so as to slide along the straight rail 4 provided on the body 2. Due to this constraint, when one end of the drive link 13 rotates, the one end of the driven link 12 slides on the straight rail 4, and the other end of the driven link 12 (the arm end) moves in a straight line. The length CF of the driven link 12 is twice the length AB of the drive link 13.

Advantages of the robot 100 will be described. Using one actuator, the robot 100 can move the arm end along the straight line trajectory Ps from the starting point Ws to the end point We. Here, the directions of the arm end are opposite each other at the starting point Ws and the end point We. Consequently, the robot 100 is suitable for moving a wafer between two mutually opposing chambers. Further, the speed of the arm end gradually increases in the vicinity of the starting point Ws and gradually decreases in the vicinity of the end point We while the motor rotational speed is held constant. This type of mechanism is also advantageous in wafer handling.

Second Embodiment

Figure 5:
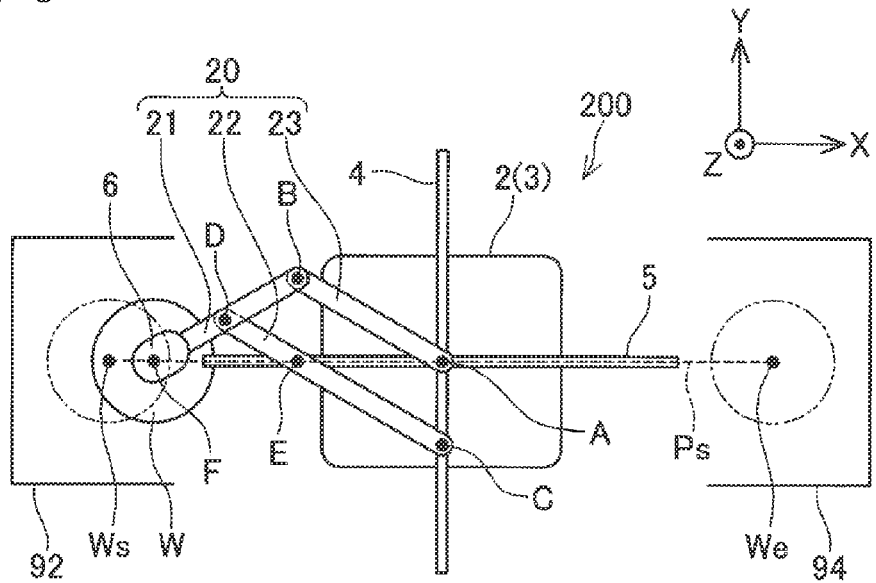
FIG. 5 is a plan view of a wafer handling robot of a second embodiment.

FIG. 5 is a plan view of a robot 200 of the second embodiment. The robot 200 of the second embodiment comprises an arm 20 composed of three links. In the Figures of the second embodiment, components that are the same as the robot 100 of the first embodiment have the same reference numbers appended thereto. A description of the identical components may be omitted.

Figure 6:
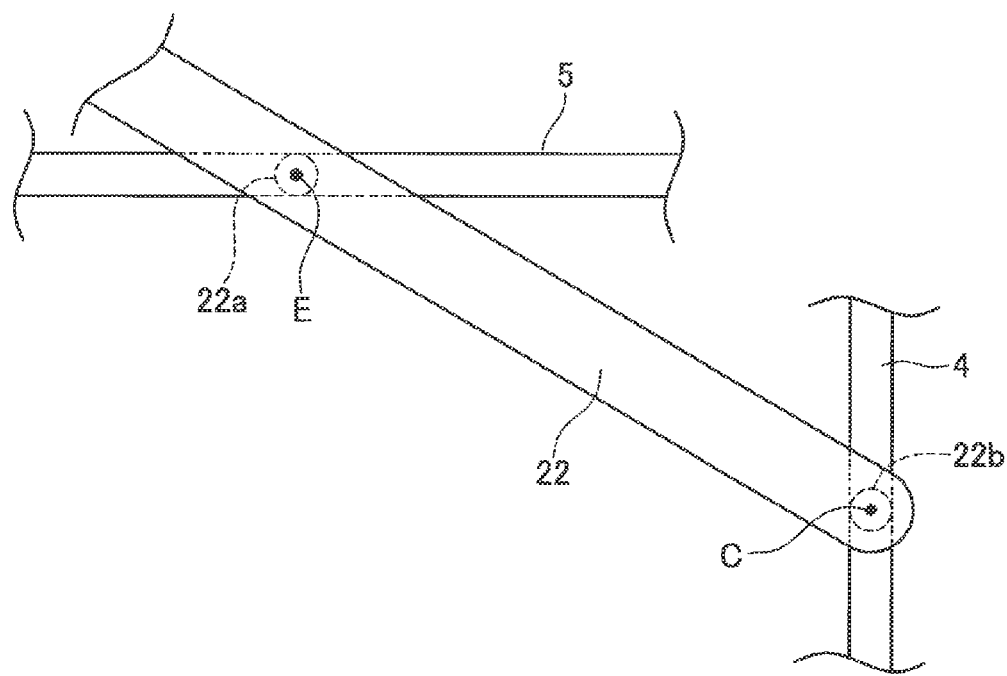
FIG. 6 is a partially enlarged plan view of the wafer handling robot of the second embodiment.

The arm 20 consists of a drive link 23, a first driven link 21, and a second driven link 22. The drive link 23 corresponds to the base of the arm 20, and one end (point A) thereof is connected to the body 2. The motor 3 is provided within the body 2, and the motor 3 rotates the drive link 23 around point A. The other end of the drive link 23 is connected to one end (point B) of the first driven link 21. The wafer holder 6 is attached to the other end (point F) of the first driven link 21. The other end (point F) of the first driven link 21 corresponds to the end of the arm 20. One end of the second driven link 22 is connected to an intermediate point (point D) of the first driven link 21. The other end (point C) of the second driven link 22 is engaged with the first straight rail 4. The other end (point C) of the second driven link 22 can move along the first straight rail 4. An intermediate point (point E) of the second driven link 22 is engaged with a second straight rail 5, and can move along the second straight rail 5. FIG. 6 shows an enlarged view of the vicinity of point E and the vicinity of point C. A slider 22b is attached to one end (point C) of the second driven link 22, and the slider 22b is engaged with the first straight rail 4. A slider 22a is attached to the intermediate point (point E) of the second driven link 22, and this slider 22a is engaged with the second straight rail 5. As is clear from FIG. 5, the first straight rail 4 and the second straight rail 5 are orthogonal.

In the arm 20, the movement of one end (point C) of the second driven link 22 is restricted by the first straight rail 4, and the movement of the intermediate point (point E) is restricted by the second straight rail 5. Due to this restriction, when the drive link 23 rotates clockwise around point A, the arm end (point F) moves along a straight or curved line. The trajectory Ps of the arm end depends on the geometrical shape (configuration) of each link. The arm 20 has the relationship AB=BF=CE=2ED. According to this relationship, when the drive link 23 rotates around point A, the arm end (point F) moves along the straight line trajectory Ps. The trajectory Ps of the arm end is a straight line, in which point Ws is the starting point and point We is the end point. Point Ws corresponds to the wafer set position of the one chamber 92, and point We corresponds to the wafer set position of the other chamber 94.

Figure 7A:
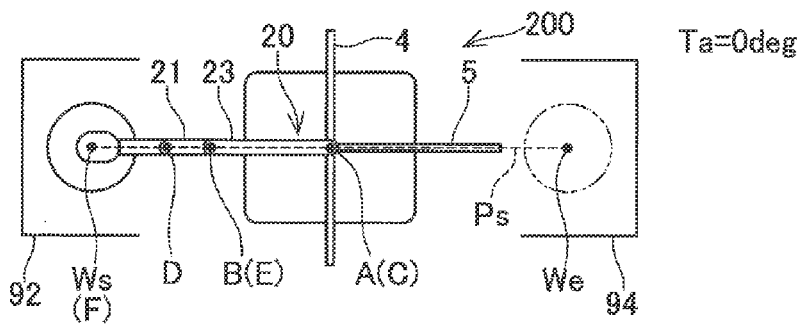
FIG. 7A is a diagram illustrating the movement of the wafer handling robot of the second embodiment (Ta=0 deg).
Figure 7B:
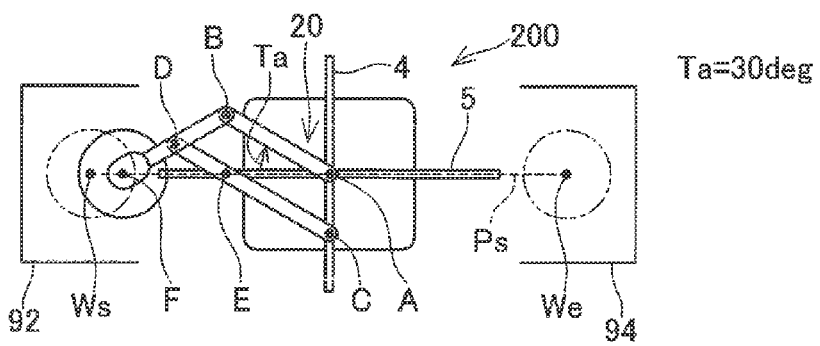
FIG. 7B is a diagram illustrating the movement of the wafer handling robot of the second embodiment (Ta=30 deg).
Figure 7C:
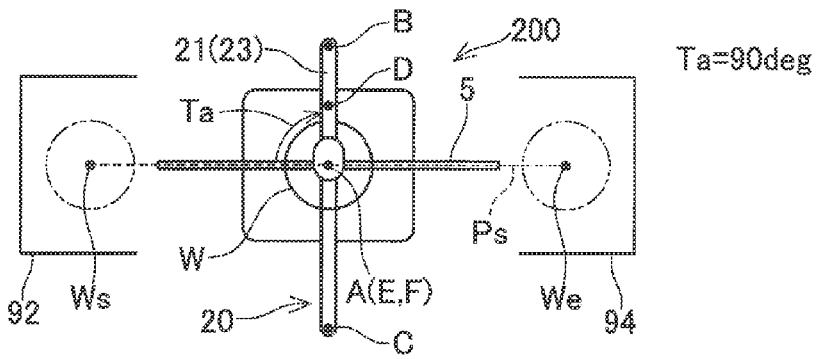
FIG. 7C is a diagram illustrating the movement of the wafer handling robot of the second embodiment (Ta=90 deg).
Figure 7D:
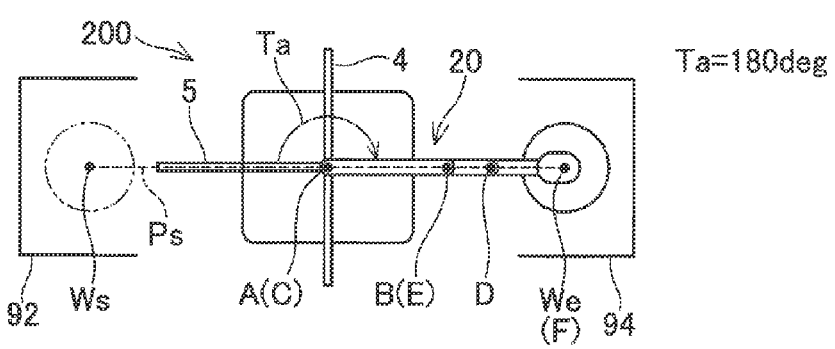
FIG. 7D is a diagram illustrating the movement of the wafer handling robot of the second embodiment (Ta=180 deg).

The movement of the arm 20 will be described with reference to FIG. 7A to FIG. 7D. As in the case of the first embodiment, the movement of the arm 20 will be described using the angle Ta between the drive link 23 and a straight line connecting point Ws and point We. First, the arm end (point F) is located at the starting point Ws. This configuration corresponds to Ta=0 (deg) (FIG. 7A). The position of the arm 20 at Ta=30 (deg) is shown in FIG. 7B. The triangle ABF always forms an isosceles triangle. FIG. 7C shows the arm position at Ta=90 (deg), and FIG. 7D shows the arm position at Ta=180 (deg). At Ta=90 (deg), the arm end (point F) is positioned at the middle point of the trajectory Ps. The middle point of the trajectory Ps is identical to the center of rotation (point A) of the base of the arm.

As is clear from FIG. 7A to FIG. 7D, the end (point F) of the arm 20 moves along the straight line trajectory Ps. Further, the directions of the arm end at the starting point (the point Ws) and at the end point (the point We) of the trajectory Ps are mutually opposite. As in the first embodiment, when the drive link 23 is rotating at a constant angular velocity, the speed of the end of the arm 20 increases monotonically from the starting point Ws to the middle point (point A), and decreases monotonically from the middle point (point A) to the end point We. Consequently, the robot 200 has the same advantages as the robot 100 of the first embodiment.

The structure of the arm 20 can also be described as follows. The arm 20 comprises the drive link 23, the first driven link 21 and the second driven link 22. One end (point A) of the drive link 23 is rotatably connected to the body 2, and the other end (point B) is connected to one end of the first driven link 21. The motor 3 is provided within the body 2, and the motor 3 rotates the drive link 23 around point A. The wafer holder 6 is attached to the other end (point F) of the first driven link 21. The other end of the first driven link 21 corresponds to the arm end. One end of the second driven link 22 is connected to a middle point (point D) of the first driven link 21. The other end (point C) of the second driven link 22 is constrained so as to be slidable along the first straight rail 4 provided on the body 2. A point (point E) that is the intermediate portion along the second driven link 22, in the longitudinal direction thereof, is engaged in a slidable manner with the second straight rail 5, which is orthogonal to the first straight rail 4. Point E is positioned at a distance from point D that is one third of the length of the second driven link 22. Due to this restraint of the second driven link 22, when the drive link 23 rotates, one end (corresponding to the arm end) of the first driven link 21 moves on the straight line trajectory Ps. The starting point Ws and the end point We of the straight line trajectory Ps, and the center of rotation (point A) of the drive link 23, are aligned in a straight line. Further, the starting point Ws and the end point We are positioned at an equal distance from the center of rotation (point A). Furthermore, the directions of the arm end at the starting point Ws and at the end point We are mutually opposite. The length AB of the drive link 23 is identical to the length BF of the first driven link 21, and is also identical to the distance CE between the two constraint points (point C and point E) of the second driven link 22. The connecting point (point D) of the first driven link 21 and the second driven link 22 is at a middle point of the first driven link 21 in the longitudinal direction thereof. Due to these relationships, the drive link 23 and the second driven link 22 are always kept parallel.

Third Embodiment

Figure 8:
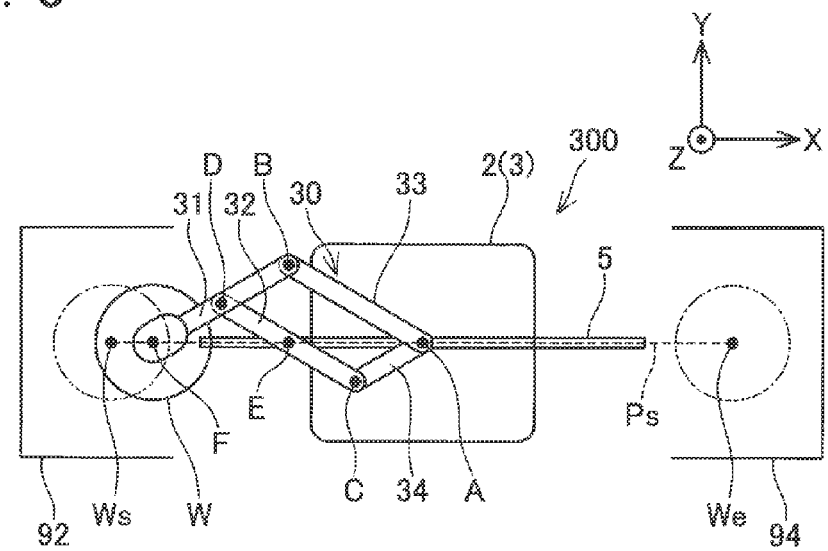
FIG. 8 is a plan view of a wafer handling robot of a third embodiment.

FIG. 8 shows a plan view of a robot 300 of the third embodiment. An arm 30 of the robot 300 of the third embodiment has a third driven link 34 instead of the first straight rail 4 of the arm 20 of the second embodiment.

The structure of the arm 30 will be described in detail. The arm 30 comprises a drive link 33, a first driven link 31, a second driven link 32, and the third driven link 34. One end (point A) of the drive link 33 is rotatably connected to the body 2, and the other end (point B) is connected to one end of the first driven link 31. The motor 3 is provided within the body 2, and the motor 3 rotates the drive link 33 around point A. The wafer holder 6 is attached to the other end (point F) of the first driven link 31. The other end (point F) of the first driven link 31 corresponds to the arm end. One end of the second driven link 32 is connected to a middle point (point D) of the first driven link 31 in the longitudinal direction. The other end (point C) of the second driven link 32 is connected to one end of the third driven link 34. The other end of the third driven link 34 is connected to the one end (point A) of the drive link 33. A middle point (point E) of the second driven link 32, in the longitudinal direction thereof, is engaged with the straight rail 5 in a slidable manner. The arm 30 is constrained such that a predetermined point (point E) on the arm slides along the straight rail 5 provided on the body 2. According to the above configuration, when the drive link 33 rotates clockwise, the one end (corresponding to the arm end) of the first driven link 31 moves along the straight line trajectory Ps. The starting point Ws and the end point We of the straight line trajectory Ps are aligned in a straight line with the center of rotation (point A) of the drive link 33. The starting point Ws and the end point We are positioned at an equal distance from the center of rotation (point A). Further, the directions of the arm end at the starting point Ws and at the end point We are mutually opposite. The length AB of the drive link 33 is identical to the length BF of the first driven link 31, and is also identical to the length CD of the second driven link 32. The connecting point (point D) of the first driven link 31 and the second driven link 32 is at the middle point of the first driven link 31 in the longitudinal direction. The length AC of the third driven link 34 is one half the length BF of the first driven link 31. The drive link 33 and the second driven link 32 are always kept parallel.

The movement of the arm 30 of the robot 300 of the third embodiment is approximately the same as the movement of the arm 20 of the robot 200 of the second embodiment. That is, the end (point F) of the arm 30 moves on the straight line trajectory Ps. Further, the directions of the arm end at the starting point Ws and at the end point We of the trajectory Ps are mutually opposite. As in the first and second embodiments, when the drive link 23 rotates at a constant angular velocity, the speed of the arm end of the arm 30 increases monotonically from the starting point Ws to a middle point (point A), and decreases monotonically from the middle point (point A) to the end point We.

Fourth Embodiment

Figure 9:
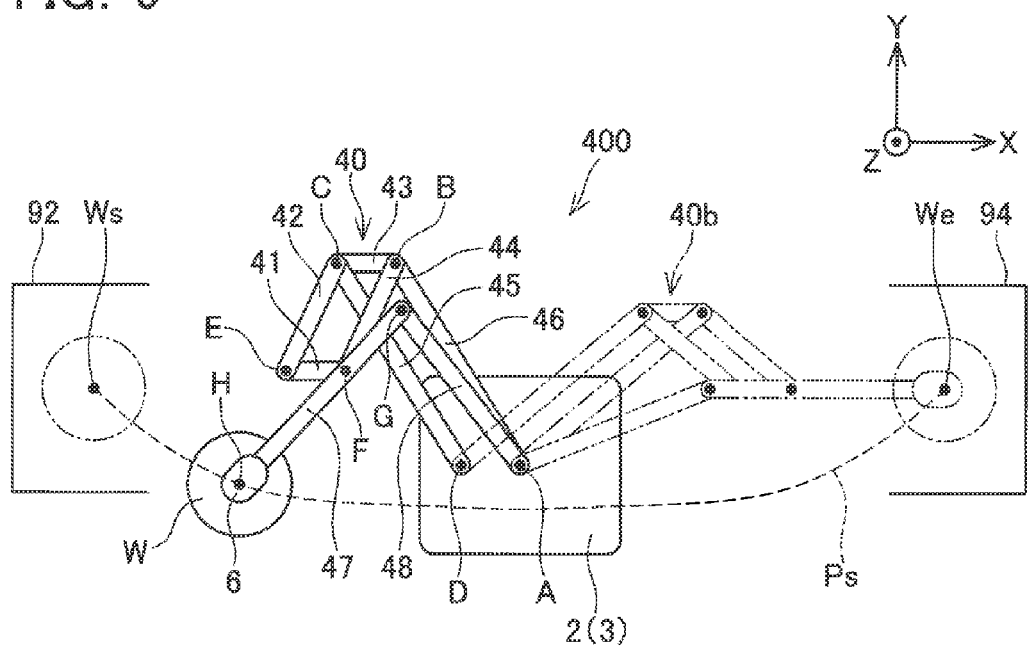
FIG. 9 is a plan view of a wafer handling robot of a fourth embodiment.

A plan view of a robot 400 of the fourth embodiment is shown in FIG. 9. The robot 400 of the fourth embodiment has more driven links, but is not provided with a rail.

An arm 40 comprises a drive link 48 and seven driven links 41 to 47. The drive link 48 corresponds to the base of the arm 40, and one end (point A) of the drive link 48 is connected to the body 2. The motor 3 is provided within the body 2, and the motor 3 rotates the drive link 48 around point A. The other end of the drive link 48 is connected to one end (point G) of the seventh driven link 47. The other end of the seventh driven link 47 corresponds to the end of the arm, and has the wafer holder 6 attached thereto. The broken line indicated by reference number 40b of FIG. 9 shows the position of arm when the arm end (point H) has reached the end point We.

The driven links 43, 45, 46 constitute one parallel link. One end (point D) of the driven link 45 and one end (point A) of the driven link 46 are connected to the body 2. The other end (point C) of the driven link 45 and the other end (point B) of the driven link 46 are each connected to a respective end portion of the driven link 43. The length BC of the driven link 43 and the distance AD are identical, and consequently the driven links 45 and 46 are always kept parallel.

The driven links 41, 42, 44 constitute another parallel link. One end (point C) of the driven link 42 is connected to one end of the driven link 43, and one end (point B) of the driven link 44 is connected to the other end of the driven link 43. The other end (point E) of the driven link 42 is connected to one end of the driven link 41, and the other end (point F) of the driven link 44 is connected to the other end of the driven link 41. The driven links 42 and 44 are always kept parallel. Further, the other end (point F) of the driven link 44 is connected to an intermediate point of the seventh driven link 47. The length CD of the driven link 45 and the length AB of the driven link 46 are identical. Further, the length CE of the driven link 42 and the length BF of the driven link 44 are also identical. Moreover, in the arm 40, the relationship (length AB)−(length BF)=(length AG)−(length FG) is satisfied.

In the arm 40 having the above configuration, when the drive link 48 rotates clockwise around point A, the arm end (point H) moves along the curved trajectory Ps. The starting point Ws corresponds to the wafer set position of the one chamber 92, and the end point We corresponds to the wafer set position of the other chamber 94. The directions of the arm end at the starting point Ws and at the end point We of the trajectory Ps are mutually opposite. When the drive link 48 is being rotated at a constant angular velocity, the speed of the arm end (point H) increases monotonically from the starting point Ws to a middle point (point A) on the trajectory Ps, and decreases monotonically from the middle point (point A) to the end point We.

Fifth Embodiment

Figure 10:
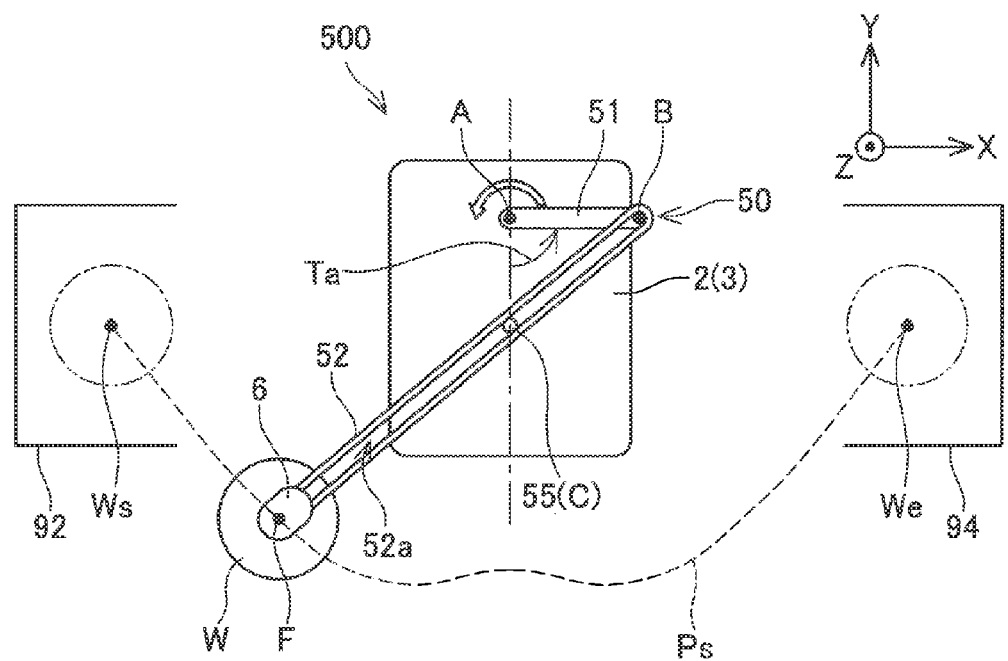
FIG. 10 is a plan view of a wafer handling robot of a fifth embodiment.
Figure 11A:
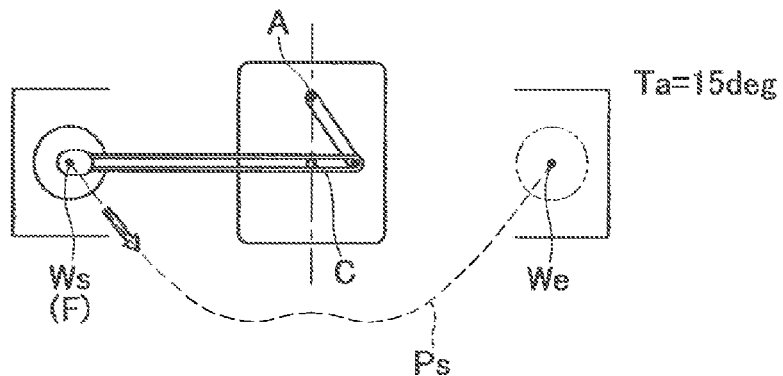
FIG. 11A is a diagram illustrating the movement of the wafer handling robot of the fifth embodiment (Ta=15 deg).
Figure 11B:
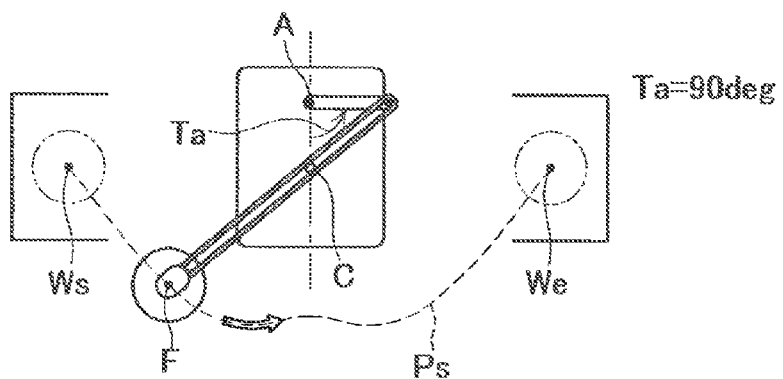
FIG. 11B is a diagram illustrating the movement of the wafer handling robot of the fifth embodiment (Ta=90 deg).
Figure 11C:
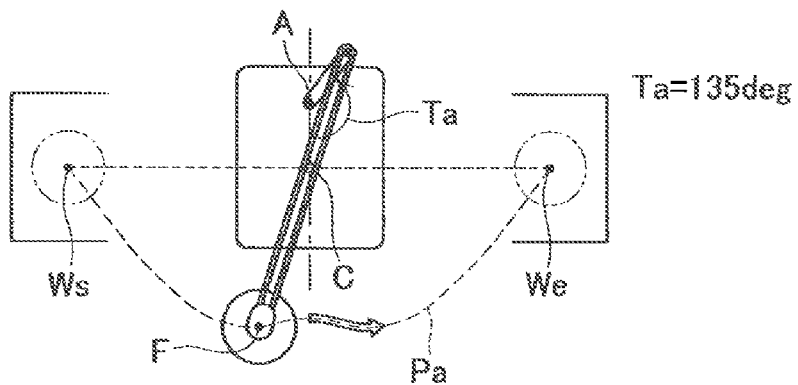
FIG. 11C is a diagram illustrating the movement of the wafer handling robot of the fifth embodiment (Ta=135 deg).
Figure 11D:
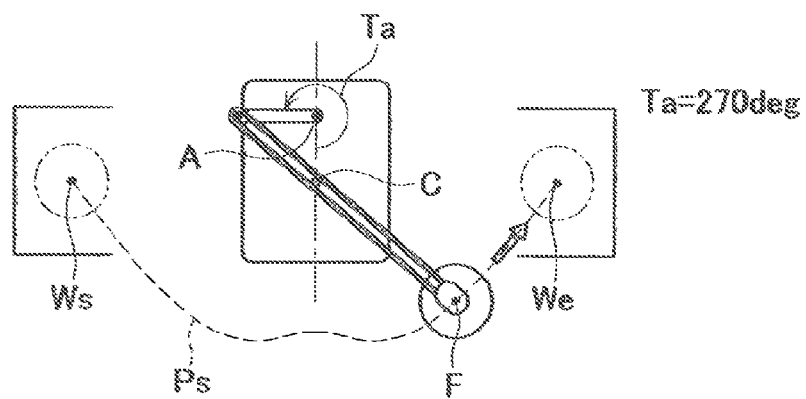
FIG. 11D is a diagram illustrating the movement of the wafer handling robot of the fifth embodiment (Ta=270 deg).
Figure 11E:
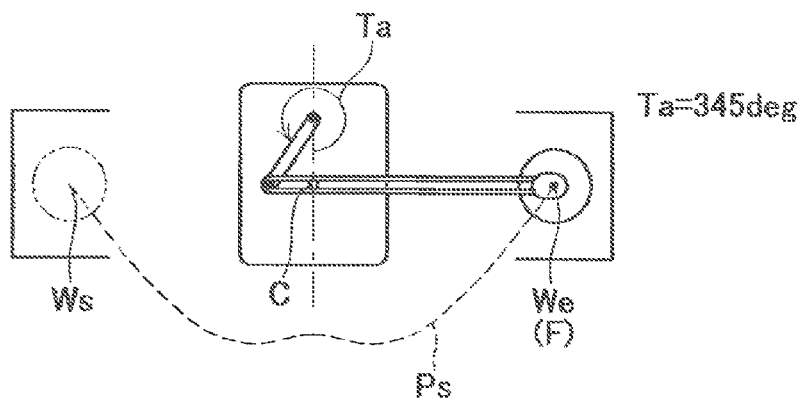
FIG. 11E is a diagram illustrating the movement of the wafer handling robot of the fifth embodiment (Ta=345 deg).

A plan view of a robot 500 of the fifth embodiment is shown in FIG. 10. The robot 500 of the fifth embodiment comprises an arm 50 consisting of two links. The arm 50 is composed of a drive link 51 and a driven link 52. The drive link 51 corresponds to the base of the arm 50, and one end (point A) of the drive link 51 is connected to the body 2. The motor 3 is provided within the body 2, and the motor 3 rotates the drive link 51 around point A. The other end (point B) of the drive link 51 is connected to one end of the driven link 52. The wafer holder 6 is attached to the other end (point F) of the driven link 52. The other end (point F) of the driven link 52 corresponds to the end of the arm 50. The driven link 52 has a slit 52a extending along a center line in its longitudinal direction. A roller 55 supported by the body 2 fits within the slit 52a. That is, the driven link 52 of the arm 50 is engaged with a predetermined constraint point (the roller 55) of the body 2 in a manner capable of sliding along the longitudinal direction of the link.

The movement of the arm will be described with reference to FIG. 11A to FIG. 11E. FIG. 11A to FIG. 11E respectively show the position of the arm at Ta=15 (deg), 90 (deg), 135 (deg), 270 (deg), 345 (deg). As is clear from FIG. 11A to FIG. 11E, due to the above structure, when the drive link 51 rotates counterclockwise around point A, the arm end (point F) moves along the curved trajectory Ps shown in FIG. 10. As shown in FIG. 10, the trajectory Ps of the arm end has point Ws as the starting point and point We as the end point. The starting point Ws corresponds to the wafer set position of the one chamber 92, and the end point We corresponds to the wafer set position of the other chamber 94. The starting point Ws and the end point We are at an equal distance from the center of rotation (point A) of the arm 50. Further, the directions of the arm end at the starting point Ws and at the end point We of the trajectory Ps are mutually opposite.

Figure 12:
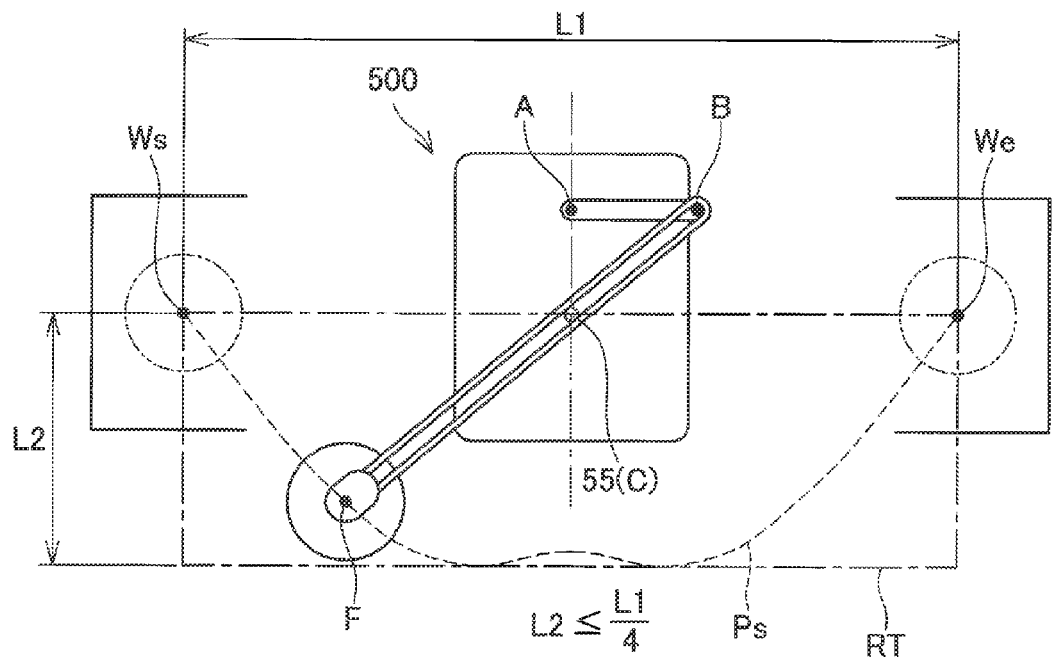
FIG. 12 is a diagram showing the range of movement of the end of the wafer handling robot of the fifth embodiment.

In FIG. 12 the range that the arm end (point F) of the robot 500 moves is shown. The rectangle indicated by reference symbol RT is an area surrounding the trajectory Ps of the arm end. In FIG. 12, the length L1 of the long side of the rectangle RT corresponds to the length of a line segment connecting the starting point Ws and the end point We of the trajectory Ps. The length L2 of the short side of the rectangle RT is less than or equal to a quarter of the length L1 of the long side. The advantage of the length L2 of the short side being less than or equal to a quarter of the length L1 of the long side will be explained below.

Figure 13:
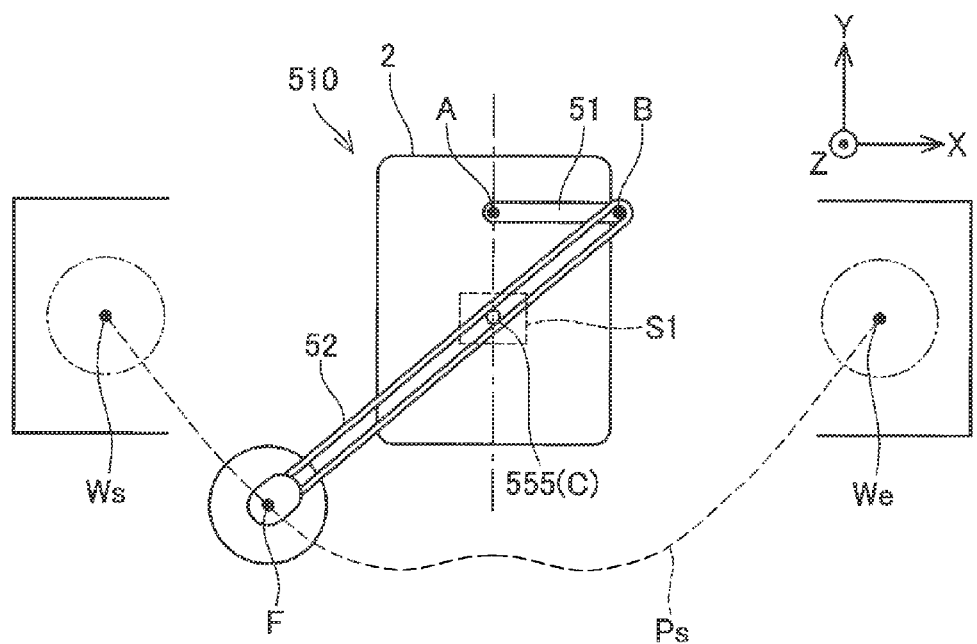
FIG. 13 is a plan view of a variant of the wafer handling robot of the fifth embodiment.
Figure 14:
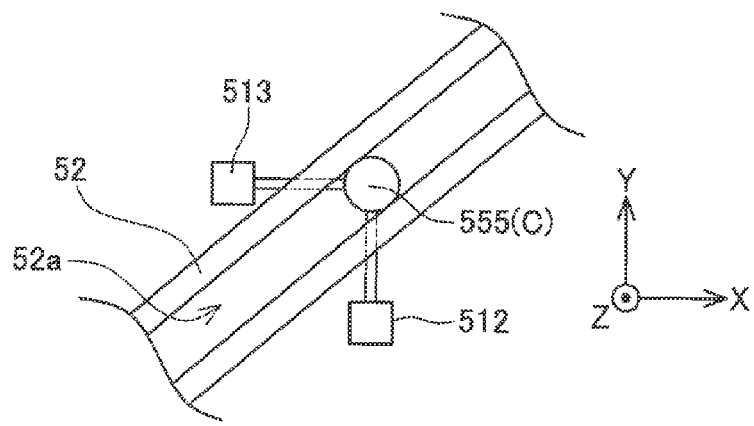
FIG. 14 is an enlarged view of a region S1 of FIG. 13.

Next, a variant of the fifth embodiment will be described. FIG. 13 is a plan view of a robot 510 of the variant. FIG. 14 is an enlarged view of the region surrounded by reference symbol S1 of FIG. 13. The robot 510 is characterized by the mechanism of a roller 555 that constrains the driven link 52. The roller 555 of this variant is supported by the body 2 via two sub actuators 512, 513. The sub actuators 512, 513 are piezo elements, and move the position of the roller 555 slightly within the XY plane (the plane of movement of the arm end). By finely moving the position of the roller 555, the position of the end of the arm 50 can be adjusted finely.

Figure 15:
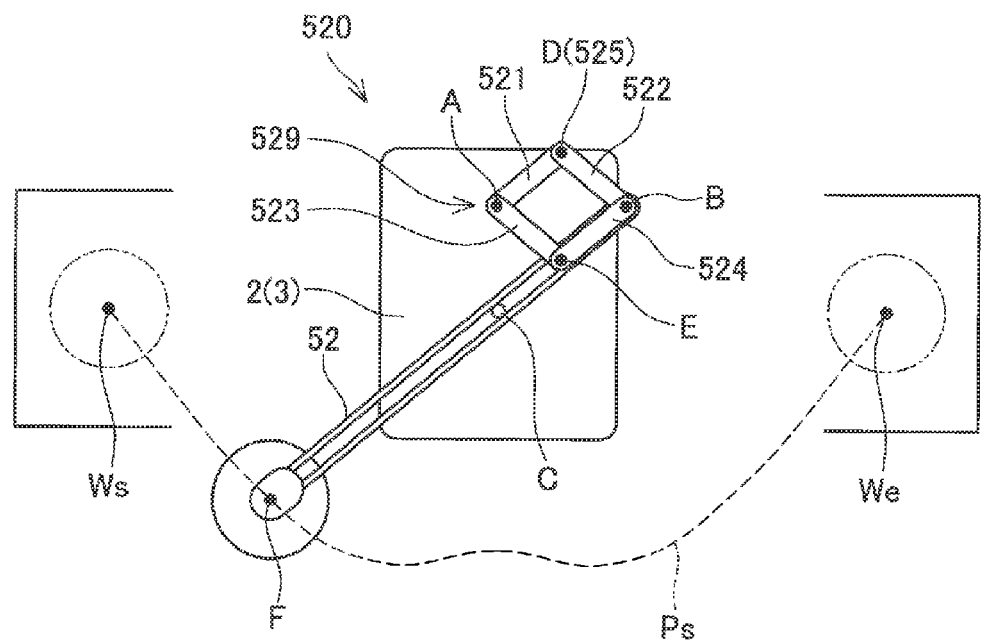
FIG. 15 is a plan view of another variant of the wafer handling robot of the fifth embodiment.

FIG. 15 is a plan view of a robot 520 of another variant of the fifth embodiment. In this robot 520, four sub links 521, 522, 523, and 524 constitute a drive link 529. The four sub links 521, 522, 523, and 524 constitute a pantograph mechanism. The motor 3 rotates the end (point B) of the drive link 529 around the rotational axis (point A) of the base of the arm. A sub motor 525 (sub actuator) is provided on the drive link 529. The sub motor 525 changes the angle of the sub links 521 and 522, thus changing the length AB of the drive link 529. By changing the length of the drive link 529, the position of the arm end relative to the base (point A) can be adjusted finely.

Both the robots 510, 520 of the variants have a mechanism for finely adjusting the position of the arm end, and a sub actuator therefor. In other words, the fine adjustment mechanism including the sub actuator is for moving the constraint point described above. The positions of the wafer at the starting point Ws and at the end point We can be adjusted by the fine adjustment mechanism.

Sixth Embodiment

In all the wafer handling robots described above, the starting point Ws and the end point We of the trajectory of the arm end are positioned at an equal distance from the center of rotation of the drive link, and the directions of the arm end at the starting point Ws and at the end point We of the trajectory are opposite. The techniques taught by the present specification are not restricted to cases in which the direction of the arm end at the starting point Ws and the direction of the arm end at the end point We form an angle of 180 degrees. Wafer handling robots taught by the present specification may have a starting point Ws and an end point We of the trajectory of the arm end positioned at an equal distance from the center of rotation of the drive link, and the direction of the arm end at the starting point Ws and the direction of the arm end at the end point We of the trajectory may be any direction, such that a mirror image relationship is satisfied with respect to a straight line passing through the center of rotation and the middle point between the starting point Ws and the end point We.

Figure 16:
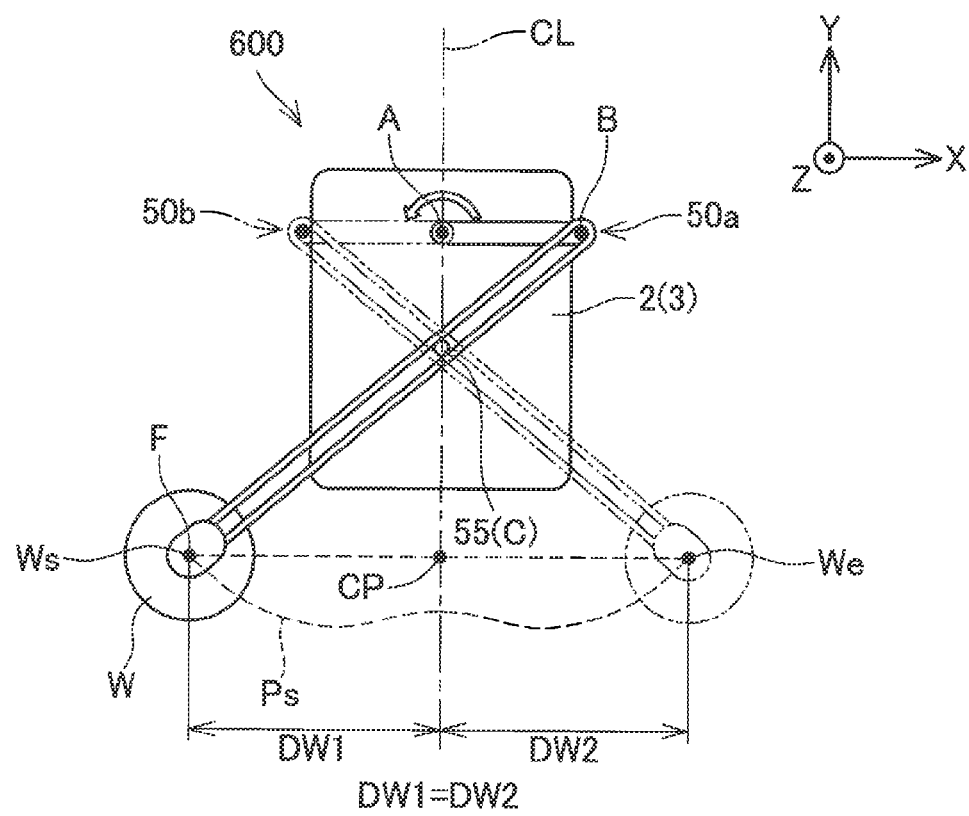
FIG. 16 is a plan view of a wafer handling robot of a sixth embodiment.

A robot 600 satisfying this relationship will be described (sixth embodiment). FIG. 16 shows a plan view of the robot 600. The geometric structure of the robot 600 is identical to that of the robot 500 of the fifth embodiment. An explanation of the structure of the robot 600 will be omitted. Only the positions of the starting point Ws and the end point We in the trajectory Ps of the arm end of the robot 600 differ from the fifth embodiment. The positions of the starting point Ws and the end point We for the robot 600 are located within the trajectory Ps of the robot 500 of the fifth embodiment. Point CP shown in FIG. 16 is a middle point between the starting point Ws and the end point We. That is, the distance DW1 between the starting point Ws and point CP is identical to the distance DW2 between the end point We and point CP (DW1=DW2). Straight line CL of FIG. 16 is a straight line passing through point CP and point A (the center of rotation of the drive link). As is clear from FIG. 16, the posture of the arm (arm 50a) when the arm end (point F) is located at the starting point Ws, and the posture of the arm (arm 50b) when the arm end is located at the end point We have a mirror image relationship with respect to the straight line CL. This means that the direction of the arm end at the starting point Ws and the direction of the arm end at the end point We satisfy a mirror image relationship with respect to the straight line CL. This robot 600 also has the same advantages as the robots of the other embodiments.

Moreover, in case the direction of the arm end at the starting point Ws and the direction of the arm end at the end point We form an angle of 180 degrees (the first to fifth embodiments), the direction of the arm end at the starting point Ws and the direction of the arm end at the end point We necessarily satisfy a mirror image relationship with respect to a straight line passing through the center of rotation and a middle point between the starting point Ws and the end point We.

Points to keep in mind for the above-described embodiments will be mentioned. The trajectory of the arm end is a straight line in the robots of the first to third embodiments. The trajectory of the arm end is not restricted to a straight line, but may be a curved line. For example, in the robot 400 of the fourth embodiment and the robot 500 of the fifth embodiment (the robot 600 of the sixth embodiment), the trajectory of the arm end traces a curved line. Further, in the robots of the first to third embodiments, the arm trajectory can also be changed by changing the length of the links.

Figure 17:
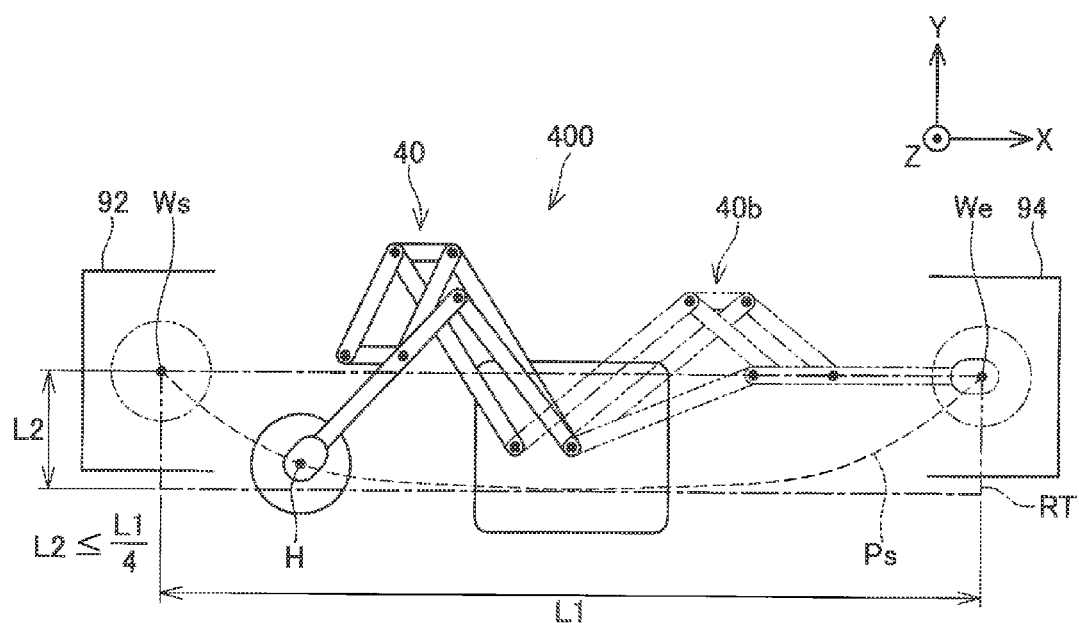
FIG. 17 is a diagram showing the range of trajectory of the wafer handling robot of the fourth embodiment.

FIG. 17 is a figure showing a rectangle RT surrounding the trajectory Ps that the arm end of the robot 400 of the fourth embodiment traces. In FIG. 17, the length L1 of the long side of the rectangle RT corresponds to the length of the line segment connecting the starting point Ws and the end point We of the trajectory Ps. The length L2 of the short side of the rectangle RT is a quarter or less than the length L1 of the long side. That is, the trajectory Ps of the arm end is defined within the range of the rectangle RT in which the line segment connecting the starting point Ws and the end point We is the long side, and the length of the short side is a quarter of the long side.

The advantages of defining the trajectory Ps of the arm end within the range of the rectangle RT will be described. A mechanism is frequently utilized in which, in an arm having an end movement within a plane, two links having the same length are connected in series. The length of one link arm is LT. In this case, the maximum reachable distance of the arm end is the distance 2LT from the center of rotation of the base. Consequently, the maximum distance from the starting point to the end point of the arm trajectory is 4LT. On the other hand, since the length of one link is LT, the range of movement of the arm must not be smaller than the range of the radius LT from the center of rotation of the base. In that case, the trajectory of the end of the two-link arm (link length LT) is generally within the range of the rectangle RT in which the line segment connecting the starting point Ws and the end point We is the long side, and the length of the short side is a quarter of the long side. In the wafer handling robots of the embodiments taught by the present specification as well, the trajectory of the arm end is defined within the range of the rectangle RT in which the line segment connecting the starting point Ws and the end point We is the long side, and the length of the short side is a quarter of the long side. That is, the wafer handling robots of the embodiments taught by the present specification also have a range that is equivalent to the range of the arm end trajectory of a conventional wafer handling robot having a two-link arm. On the other hand, the conventional wafer handling robot has at least two actuators, an actuator for extending the arm and an actuator for rotating the arm and, since the motor of each is operated separately, significant time was required to move the arm end from the starting point to the end point. Since the wafer handling robots of the embodiments taught by the present specification can, using one actuator, move the arm end from the starting point to the end point (to the end point where the direction of the arm end is opposite the starting point), the movement of the arm end is smooth.

Representative, non-limiting examples of the present invention have now been described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed above may be utilized separately or in conjunction with other features and teachings to provide improved wafer handling robots.

Moreover, combinations of features and steps disclosed in the above detailed description may not be necessary to practice the invention in the broadest sense, and are instead taught merely to particularly describe representative examples of the invention. Furthermore, various features of the above-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

While specific examples of the present invention have been described above in detail, these examples are merely illustrative and place no limitation on the scope of the claims. The technology described in the claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

The invention claimed is:

1. A wafer handling robot comprising:
   a body,
   an arm having a drive link and at least one driven link coupled thereto, the drive link being rotatably connected to the body and an arm end being defined on the at least one driven link,
   a constraint point mounted on the body such that the constraint point is not movable relative to the body while the wafer handling robot is transferring a wafer,
   a semiconductor wafer holder attached to the arm end, and
   an actuator configured to rotate the drive link,
   wherein:
   the arm further includes a link mechanism configured to restrict motion of the arm end, caused by rotation of the drive link, to a straight or curved trajectory;
   the at least one driven link is engaged with the constraint point, such that said at least one driven link is slidable relative to the constraint point along a longitudinal direction of the at least one driven link;
   a starting point and an end point of the trajectory of the arm end are positioned equal distantly from a center of rotation of the drive link; and
   the arm end, when disposed at the starting point, is oriented in a mirror image of the arm end, when disposed at the end point, with respect to a straight reference line passing through the center of rotation and a middle point between the starting and the end points.

2. The wafer handling robot of claim 1, further comprising a sub actuator configured to move the constraint point relative to the body.

3. The wafer handling robot of claim 2, wherein the sub-actuator includes a first sub-actuator and a second sub-actuator, each being configured to move the constraint point within an XY plane containing a movement path of the at least one driven link.

4. The wafer handling robot of claim 1, wherein:
   a slit extends longitudinally along a center link of the at least one driven link; and
   a roller is provided at the constraint point and is slidably engaged within the slit of the at least one driven link.

5. The wafer handling robot of claim 1, wherein directions of the wafer holder and the arm end at the starting and the end points of the trajectory are opposite each other.

6. The wafer handling robot of claim 1, wherein the trajectory is entirely disposed within an imaginary rectangular having a long side and a short side, wherein the long side corresponds to, and has a length equal to, a line connecting the starting and the end points, and the short side has a length equal to one-fourth of the long side.

7. The wafer handling robot of claim 1, wherein the wafer holder is non-rotatably attached to the arm end.

8. A wafer handling robot comprising:
a body,
a drive link having a first end and a second end,
a driven link having a first end, a second end and a slit extending along a center line in its longitudinal direction, the second end of the drive link being pivotably coupled to the second end of the driven link,
a semiconductor wafer holder fixedly attached to the first end of the driven link,
a motor fixedly coupled to the body and configured to rotate the first end of the drive link about a center of rotation,
a roller supported by the body via first and second sub-actuators, the roller being slidably engaged within the slit of the driven link, wherein:
the first and second sub-actuators are configured to move the roller within an XY plane containing a movement path of the driven link,
a starting point and an end point of the trajectory of the first end of the driven link are positioned equal distantly from the center of rotation of the drive link; and
the semiconductor wafer holder and the first end of the driven link, when disposed at the starting point, are respectively oriented in a mirror image of the semiconductor wafer holder and the first end of the driven link, when disposed at the end point, with respect to a straight reference line extending along the straight rail and passing through the center of rotation, the straight reference line intersecting a middle point between the starting and the end points.

* * * * *